United States Patent [19]
Yamazaki et al.

[11] Patent Number: 6,092,299
[45] Date of Patent: Jul. 25, 2000

[54] VACUUM PROCESSING APPARATUS

[75] Inventors: Koichi Yamazaki; Shigeru Kasai, both of Yamanashi-ken, Japan

[73] Assignee: Tokyo Electron Limited, Japan

[21] Appl. No.: 09/146,398

[22] Filed: Sep. 3, 1998

[30] Foreign Application Priority Data

Sep. 5, 1997 [JP] Japan .................................. 9-241185

[51] Int. Cl.[7] .................................................. F26B 13/30
[52] U.S. Cl. ................................. 34/92; 34/278; 432/245
[58] Field of Search ............................... 34/92, 278, 275, 34/402, 403, 406; 432/239, 245

[56] References Cited

U.S. PATENT DOCUMENTS

| | | |
|---|---|---|
| 2,859,812 | 11/1958 | Swanson . |
| 2,861,712 | 11/1958 | Bermingham . |
| 3,955,702 | 5/1976 | Lundy . |
| 4,042,971 | 8/1977 | Brennecke et al. . |
| 4,298,718 | 11/1981 | Mayr et al. ......................... 526/124.2 |
| 4,333,123 | 6/1982 | Moulden . |
| 4,340,462 | 7/1982 | Koch . |
| 4,399,054 | 8/1983 | Ferraris et al. ...................... 502/125 |
| 4,459,267 | 7/1984 | Bunce et al. . |
| 4,495,338 | 1/1985 | Mayr et al. ......................... 526/124.2 |
| 4,523,985 | 6/1985 | Dimock . |
| 4,553,069 | 11/1985 | Purser . |
| 4,643,629 | 2/1987 | Takahashi et al. . |
| 4,675,530 | 6/1987 | Rose et al. . |
| 4,724,222 | 2/1988 | Feldman . |
| 4,786,814 | 11/1988 | Kolondra et al. . |
| 4,789,564 | 12/1988 | Kanner et al. . |
| 4,797,054 | 1/1989 | Arii . |
| 4,804,837 | 2/1989 | Farley . |
| 4,870,923 | 10/1989 | Sugimoto . |
| 4,892,615 | 1/1990 | Motta . |
| 4,924,800 | 5/1990 | Tanaka . |
| 4,982,138 | 1/1991 | Fujiwara et al. . |
| 4,990,047 | 2/1991 | Wagner et al. . |
| 5,070,814 | 12/1991 | Whiffin et al. . |
| 5,080,549 | 1/1992 | Goodwin et al. . |
| 5,099,557 | 3/1992 | Engelsberg . |
| 5,110,248 | 5/1992 | Asano et al. . |
| 5,155,652 | 10/1992 | Logan et al. . |
| 5,181,819 | 1/1993 | Sakata et al. . |

(List continued on next page.)

FOREIGN PATENT DOCUMENTS

| | | |
|---|---|---|
| 0 395 083 A2 | 4/1990 | European Pat. Off. . |
| 0 553 805 A1 | 4/1993 | European Pat. Off. . |
| 0 553 806 A1 | 4/1993 | European Pat. Off. . |
| 0546178 | 6/1993 | European Pat. Off. . |
| 52-67353 | 3/1977 | Japan . |
| 57-104218 | 6/1982 | Japan . |
| 58-93323 | 6/1983 | Japan . |
| 58-131430 | 8/1983 | Japan . |
| 59-124140 | 7/1984 | Japan . |
| 59-177368 | 10/1984 | Japan . |
| 63-17521 | 1/1988 | Japan . |
| 4-124076 | 4/1992 | Japan . |
| 4-336421 | 11/1992 | Japan . |
| 4-358074 | 12/1992 | Japan . |
| 5-129210 | 5/1993 | Japan . |
| 750994 | 6/1956 | United Kingdom . |

*Primary Examiner*—Henry Bennett
*Assistant Examiner*—Pamela A. Wilson
*Attorney, Agent, or Firm*—Graham & James LLP

[57] ABSTRACT

A present vacuum treating apparatus comprises a process chamber for subjecting an object to a predetermined process in a predetermined vacuum state, a stage located in the process chamber and on which the object is placed, a lamp unit provided at the lower side of the processing chamber and having a plurality of lamps as a light source and adapted to heat the object on the stage by a heat energy of light directed from these lamps to the stage for illumination, a rotation shaft connected to the lamp unit to rotate the lamp unit, a support body rotatably supporting the rotation shaft, and a thermo-module provided at a contacting area of the support body selective to the rotation shaft and, by absorbing heat on its rotation shaft side and dissipating heat on its support body side, transferring the heat on the lamp unit to the support body through the rotation shaft.

13 Claims, 4 Drawing Sheets

U.S. PATENT DOCUMENTS

| | | |
|---|---|---|
| 5,203,925 | 4/1993 | Shibuya et al. . |
| 5,221,201 | 6/1993 | Yamaga et al. . |
| 5,252,134 | 10/1993 | Stauffer . |
| 5,254,229 | 10/1993 | Ohmi et al. . |
| 5,273,423 | 12/1993 | Shiraiwa . |
| 5,275,683 | 1/1994 | Arami et al. . |
| 5,277,579 | 1/1994 | Takanabe . |
| 5,278,138 | 1/1994 | Ott et al. . |
| 5,286,978 | 2/1994 | Yoshida et al. . |
| 5,303,671 | 4/1994 | Kondo et al. . |
| 5,306,921 | 4/1994 | Tanaka et al. . |
| 5,316,970 | 5/1994 | Batchelder et al. . |
| 5,383,970 | 1/1995 | Asaba et al. . |
| 5,462,397 | 10/1995 | Iwabuchi . |
| 5,492,862 | 2/1996 | Misumi . |
| 5,501,870 | 3/1996 | Shiraishi et al. . |
| 5,591,269 | 1/1997 | Arami et al. . |
| 5,676,757 | 10/1997 | Ikeda et al. . |
| 5,681,614 | 10/1997 | Omori et al. . |
| 5,871,811 | 2/1999 | Wang et al. ............... 427/248.1 |

TO AN OUTSIDE

VACUUM PROCESSING APPARATUS

BACKGROUND OF THE INVENTION

The present invention relates to a vacuum processing apparatus for subjecting an object, such as an LCD (liquid crystal display) substrate and semi-conductor wafer, to a predetermined process.

In general, a vacuum processing apparatus for subjecting an object, such as an LCD substrate and semiconductor wafer, to a predetermined process has a load-lock chamber equipped with a transfer arm means and a process chamber arranged adjacent to the load-lock chamber. These chambers are set in the predetermined vacuum state. Those objects set in the load-lock chamber are transferred, one by one, out of the load-lock chamber into the process chamber with the use of the transfer arm means. In the process chamber, the object is subjected to a predetermined process and, after being processed in the process chamber, is returned again back to the load-lock chamber.

A stage (susceptor) is provided in the process chamber to place a to-be-processed object thereon.

FIGS. 4 and 5 show one conventional form of a vacuum processing apparatus. As shown in FIG. 4, the vacuum chamber apparatus has a process chamber 1 for subjecting a semiconductor wafer W, as an object to be processed, to a predetermined process. A stage (susceptor) 2 is located at a bottom side of the process chamber 1 to place the wafer W thereon. At the lower side of the process chamber, a lamp unit 4 is provided to heat the wafer W through the stage 2.

The lamp unit 4 includes a plurality of halogen lamps 3 and is mounted at a lamp housing 8. The lamp housing 8 is mounted on the upper end of a shaft 5 vertically extending on the lower side of the process chamber 1. The shaft 5 is rotatably journaled by a bearing 7 on a support body 6. A rotation drive mechanism (not shown) is connected to the lower end side of the shaft 5. When the shaft 5 is rotated at a rate of, for example, 10-odd revolutions per minute through the rotation drive mechanism, then, in accordance therewith, the lamp unit 4 mounted on the lamp unit 4 is rotated. As shown in FIG. 5, the lamp unit 4 has reflectors 3a each plated with gold.

In the case where the wafer W is heated by the lamp unit 4 equipped with the halogen lamps 3, the lamp housing 8 and its surrounding areas become high in temperature. This produces the problem of the halogen lamp 3 being shorter in service lift due to the overheating of the halogen lamp and the gold-plated portions of the reflector 3a being deteriorated. In order to prevent such a problem, a passage 9 leading to the peripheral area of the halogen lamp 3 is provided in the shaft 5 as shown in FIG. 5. The shaft 5 and lamp housing 8 are cooled by supplying cooling air through the passage 9. Even if the lamp housing 8 is cooled only by air supplied through the passage 9, it is not possible to lower the temperature of the lamp unit 4 which reaches a temperature of nearly 400° C. down to nearly 350° C. Therefore, the apparatus cannot continuously operate for a longer period of time. Further, the service life of the lamps 3 is also shorter and it is necessary to frequently changes lamps.

BRIEF SUMMARY OF THE INVENTION

It is accordingly the object of the present invention to provide a vacuum processing apparatus which can effectively cool a lamp unit, extend the service life of lamps and hence continuously operate for a longer period of time, and achieve an improved economy and efficiency.

The object of the present invention can be achieved by the vacuum processing apparatus below. That is, a present vacuum processing apparatus comprises a process chamber for subjecting an object to a predetermined process in a predetermined vacuum state, a stage located in the process chamber and on which the object is placed, a lamp unit provided at the lower side of the processing chamber and having a plurality of lamps as a light source and adapted to heat the object on the stage by a heat energy of light directed from these lamps to the stage for illumination, a rotation shaft connected to the lamp unit to rotate the lamp unit, a support body rotatably supporting the rotation shaft, and a thermo-module provided at a contacting area between the support body and the rotation shaft and, by absorbing heat on the rotation shaft side and dissipating the heat on the support body, transferring the heat from the lamp unit to the support body through the rotation shaft.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be explained below with reference to the accompanying drawing.

Figure 1:
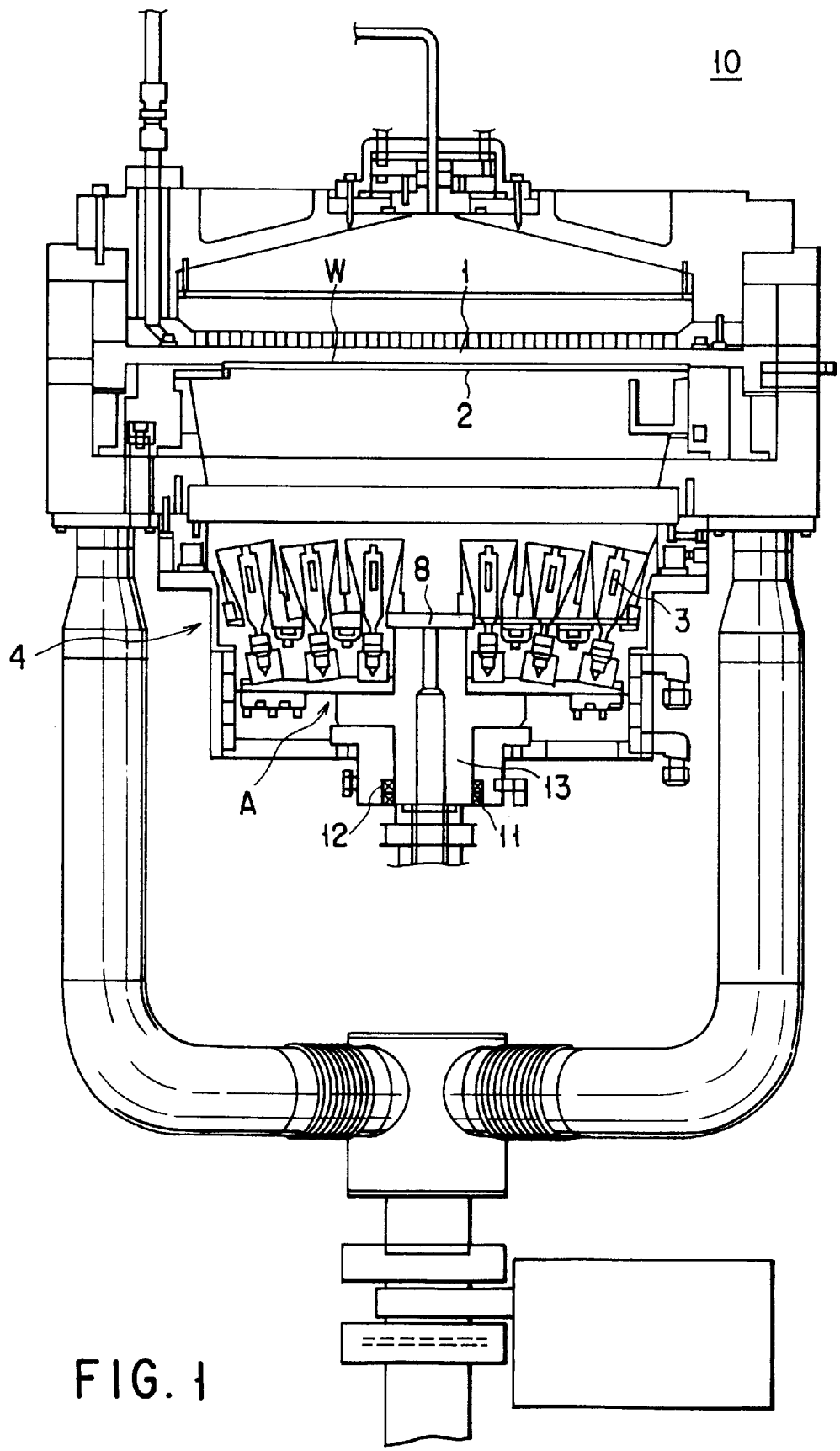
FIG. 1 is a diagrammatic view showing a vacuum processing apparatus according to one embodiment of the present invention.

As shown in FIG. 1, a vacuum processing apparatus 10 according to the embodiment of the present invention is, for example, of a CVD (chemical vapor deposition) type such that it has a process chamber 1 for subjecting a to-be-processed material, such as a semiconductor wafer W to predetermined process. The process chamber 1 has a stage (susceptor) 2 at a bottom side where the wafer W is placed. At the lower section of the process chamber 1 a lamp unit 4 is provided to heat the wafer W via the stage 2.

Figure 2:
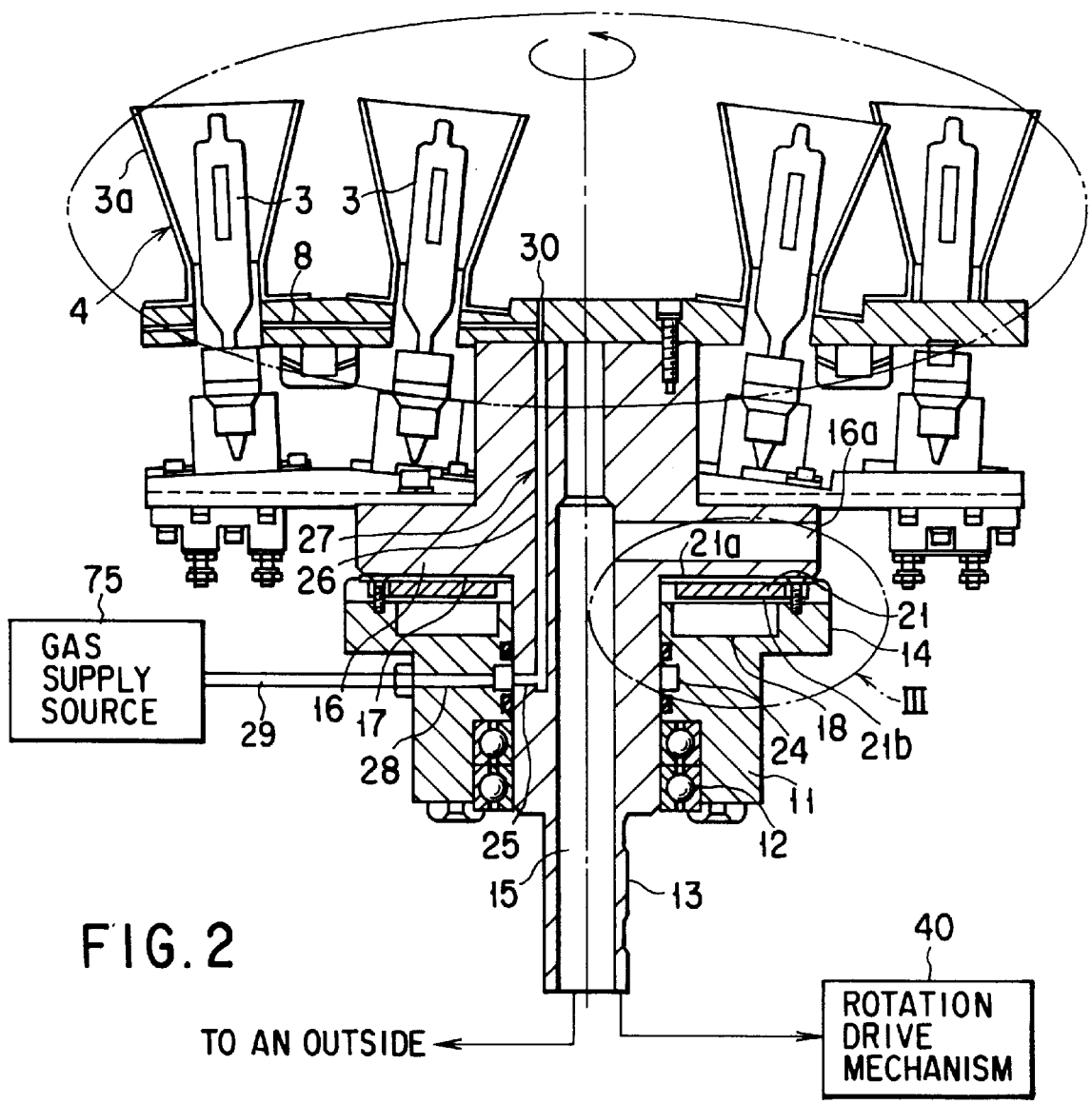
FIG. 2 is a partly enlarged cross-sectional view showing an area A in FIG. 1.

As shown in detail in FIG. 2, the lamp unit 4 has a plurality of halogen lamps 3 and is mounted in a lamp housing 8. The lamp housing 8 is mounted on the upper end of a shaft 13 vertically extending at the lower side of the process chamber 1. The shaft 13 is made of a good heat conducting material, such as aluminum, and rotatably journaled by a bearing 12 on a support body 11. A lower end side of the shaft 13 is connected to a rotation drive mechanism 40. When the shaft 13 is rotated, at a rate of 10-odd revolutions per minute, through the rotation drive mechanism 40, then the lamp unit 4 mounted at the lamp housing 8 is rotated. In this connection it is to be noted that the lamp unit 4 has reflectors 3a plated with gold.

The support body 11 is cylindrical in configuration and has a flange 14 at its upper end. The support body 11 has a through hole 15 extending along the axis of the shaft 13 and leading to an outside. A flange 16 is provided integral with the upper portion of the shaft 13 and situated opposite to the flange 14 of the support body 11.

Figure 3:
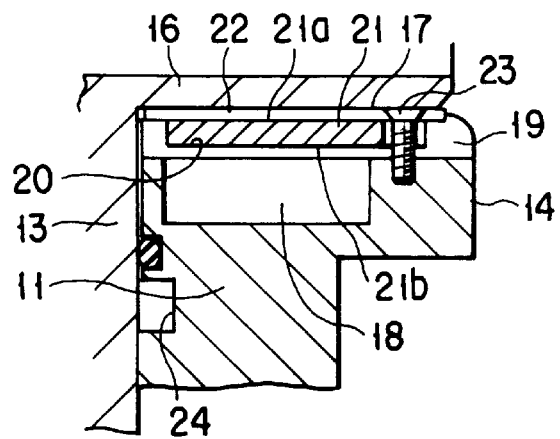
FIG. 3 is a partly enlarged cross-sectional view showing an area III in FIG. 2.
Figure 4:
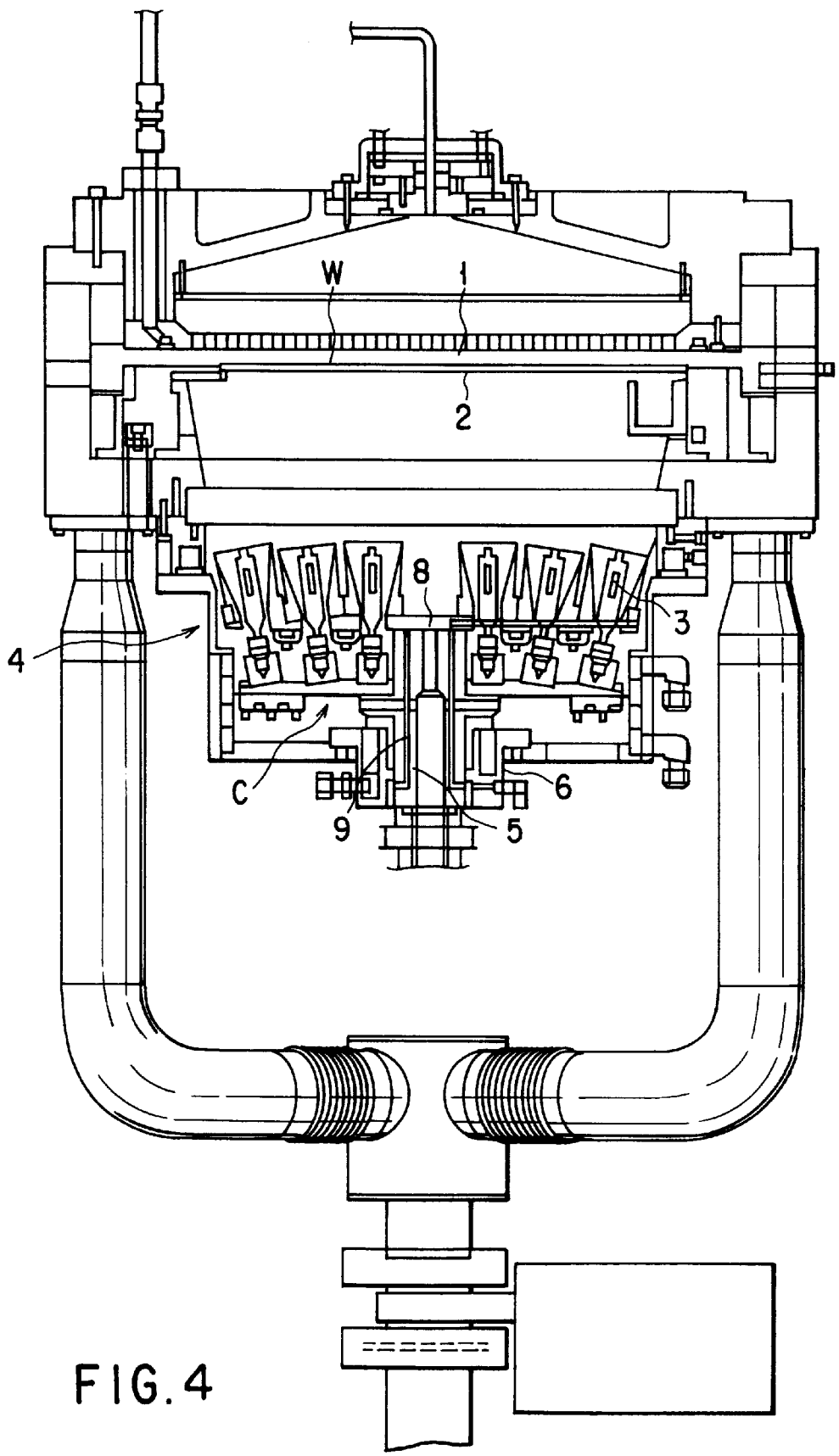
FIG. 4 is a diagrammatic view showing a conventional vacuum processing apparatus equipped with a lamp unit.
Figure 5:
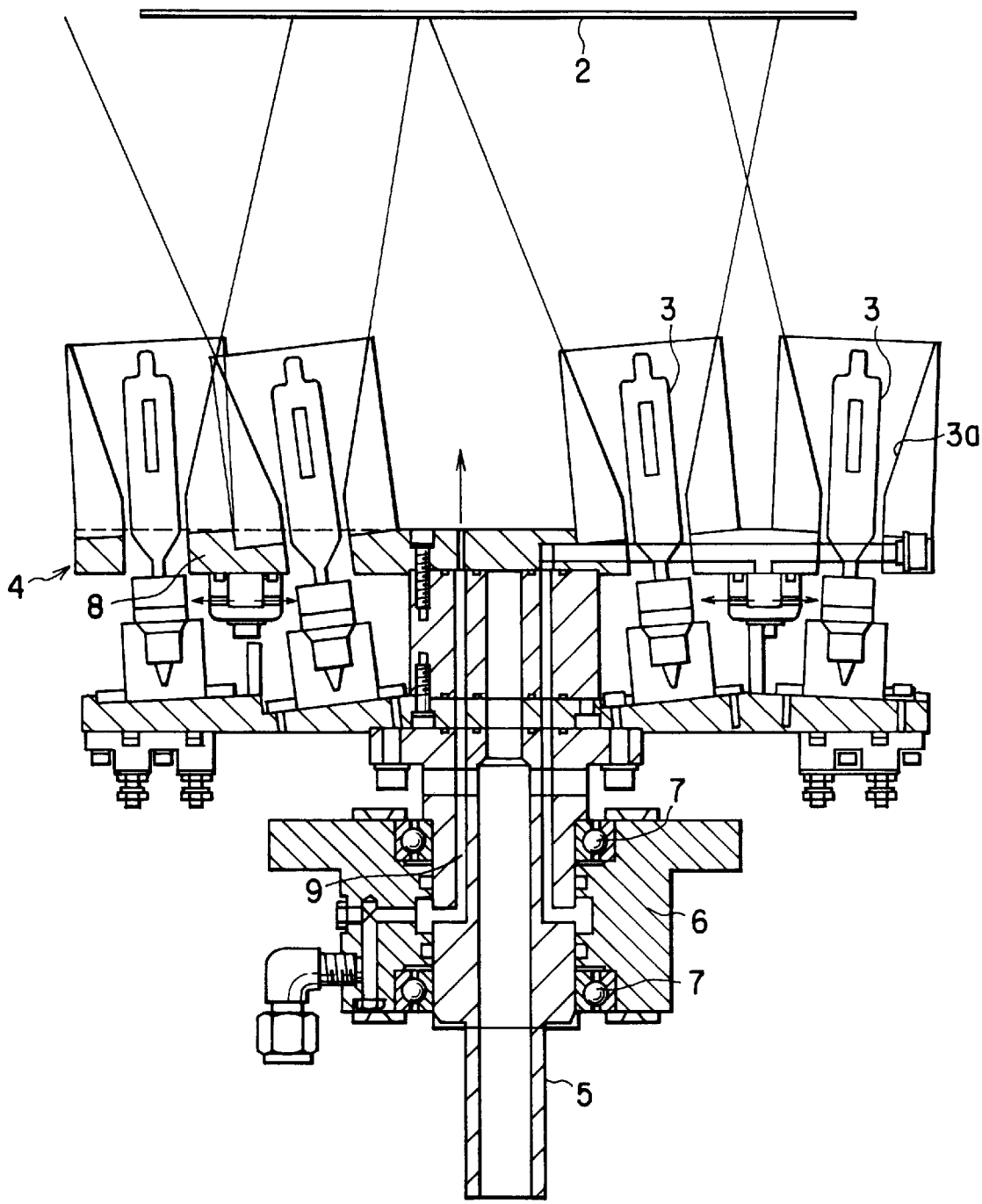
FIG. 5 is a partly enlarged cross-sectional view showing an area C in FIG. 4.

The flange 16 has a plurality of heat radiating holes 16a extending in a radial fashion. The heat radiating holes 16a are opened at the outer peripheral end face of the flange 16 and communicate with the through hole 15. An annular cooling water passage 18 is formed at the upper surface portion of the flange 14 of the support body 11. To the cooling water passage 18, cooling water is circulated from a cooling water supply source, not shown, and the cooling water passage 18 is closed by a cover 19 as shown in more detail in FIG. 3. The cover 19 has a recess 20 at its upper surface and a thermo-module 21 is disposed in the recess 20 and serves as a thermoelectric element evolving and absorbing heat under a Peltier effect. The Peltier effect is a phenomenon by which, when an electric current is passed through the junction between two dissimilar materials from one direction, heat evolution and absorption occur at the junction. The thermo-module 21, being formed through the utilization of the Peltier effect, serves as a heat pump with a heat absorption surface 21a provided at one surface and a heat evolution surface 21b provided at the other surface. In the present embodiment in particular, the thermo-module 21 is so electrically connected with the heat absorption surface 21a formed on an upper surface opposite to the flange 16 of the shaft 13 and the heat evolution surface 21b formed on the lower surface of the module.

A plate member 22 of a laminate structure is superposed on the heat absorption surface (upper surface) 21a of the thermo-module 21. The plate member 22, together with the cover 19, is fixed by a screw means 23 to the flange 14. The lower surface of the flange 16 of the shaft 13 is set in sliding contact with the upper surface of the plate member 22. That is, an area between the flange 16 of the shaft 13 and the flange 14 of the support body 11 provides a sliding area 17 where, when the shaft 13 is rotated, the lower surface of the flange 16 slides on the plate member 22.

An annular groove 24 is provided in the inner side wall of the support body 11 and communicates with a gas supply port 28 extending through the support body 11 in a radial direction. The gas supply port 28 is connected through an air supply tube 29 to a gas supply source 75 for supplying a cooling gas.

The shaft 13 has a side hole 25 extending along the radial direction of the shaft 13 and communicating with the annular groove 24 of the support body 11. Further, a vertical hole 26 is provided in the shaft 13, extends along the axial direction of the shaft 13 and communicates with the side hole 25. The vertical hole 26 is opened at the upper end of the shaft 13 and communicates with a gas exhaust outlet 30 provided in the lamp housing 8. That is, the annular groove 24, side hole 25 and vertical hole 26 provide a cooling passage 27 for allowing a cooling gas which is supplied through the gas supply port 28 to be blown onto the halogen lamps 3 and their peripheral portions via the gas exhaust outlet 30.

The function of the vacuum processing apparatus 10 thus arranged will be explained below.

In the case where a wafer W is to be subjected to a predetermined process in the process chamber 1, the wafer W is placed on the stage 2 and is heated on the stage 2 by the lamp unit 4 equipped with the halogen lamps 3. At this time, the shaft 13 is rotated by the rotation drive mechanism 40 and, together with this rotation, the lamp unit 4 mounted on the upper end of the shaft 13 through the lamp housing 8 is rotated.

The lamp unit 4 heats the wafer W, as well as the lamp housing 8, under simultaneously lit halogen lamps 3 serving as a heat source. According to the present embodiment, the halogen lamps 3 and peripheral areas are cooled so as to prevent the overheating of the halogen lamps 3 and the deterioration of the gold-plated reflectors 3a. That is, a cooling gas is supplied from the gas supply source 75 through the air supply tube 29 into the cooling gas passage 27. The gas which is supplied to the cooling gas passage 27 is blown onto the halogen lamps 3 and their peripheral areas via the gas exhaust outlet 30 provided in the lamp housing 8.

Apart from the cooling of these associated members by the cooling gas, the heat which is generated on the shaft 13 side is dissipated toward the support body 11 side by the thermo-module 21 provided between the support side 11 and the shaft 13. That is, the thermo-module 21 conducts, thus producing a heat absorption and a heat evolution, that is, providing a heat absorption surface 21a at its upper surface facing the flange 16 of the shaft 13 and a heat evolution surface 21b at its lower surface facing the support body 11. As a result, the heat of the shaft 13 is absorbed at the heat absorption surface 21a of the thermo-module 21 and dissipated toward the support body 11 side through the heat evolution surface 21b. The heat which is evolved toward the support body 11, that is, the heat on the heat evolution surface 21b, is dissipated into the cooling water circulated through the cooling water passage 18. Further, the heat of the lamp housing 8 is transferred through the shaft 13 to the heat absorption face 21b of the thermo-module 21 and dissipated through the heat evolution face 21b to the support body 11 and from there into the cooling water circulated trough the cooling water passage 18. It is to be noted that the heat radiating hole 16a and through hole 15, dissipating the heat of the shaft 13 side toward the outside, alleviate the transfer of the heat to the thermo-module 21 and hence reduce a load on the thermo-module 21.

According to the vacuum processing apparatus 10, as set out above, the halogen lamps 3 and their peripheral areas are directly cooled by the supply of the gas through the gas cooling passage 27 and are indirectly cooled by the forced absorption of the heat at the shaft 13 side by the thermo-module 21. By the combined use of the direct cooling by the gas and indirect cooling by the thermo-module utilizing the thermal transfer, the halogen lamps 3 and their peripheral areas are effectively cooled, so that the temperature of the lamp housing 8 can be suppressed to about 220° C. It is, therefore, possible to extend the service life of the halogen lamp 3 and, at the same time, prevent the deterioration of the gold-plated portions of the reflectors 3a.

Further, in the vacuum processing apparatus 10 of the present embodiment, the thermo-module 21 is located at the sliding area 17 (the contact surface area between the shaft 13 and the support body 11), so that the heat on the shaft 13 side is absorbed effectively at the heat absorption surface 21a of the thermo-module 21.

Further, according to the vacuum processing apparatus 10 of the present embodiment, the flanges 14 and 16 are provided on the support body 11 and shaft 13, respectively. Since these flanges are set in contact with each other, a greater contact area is provided between the shaft 13 and the support body 11, thus ensuring a readier transfer of the heat from the shaft 13 side to the support body 11 side and an effective cooling of the lamp unit 4.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vacuum processing apparatus comprising:

a process chamber for subjecting an object to a predetermined process in a predetermined vacuum state;

a stage located in the process chamber and on which the object is placed;

a lamp unit provided at a lower side of the process chamber, having a plurality of lamps as a light source and adapted to heat the object on the stage by a heat energy of light directed from these lamps to the stage for illumination;

a rotation shaft connected to the lamp unit to rotate the lamp unit;

a support body rotatably supporting the rotation shaft; and a thermo-module provided at a contacting area between the support body and the rotation shaft and, by absorbing heat on the rotation shaft side and dissipating the heat on the support body, transferring the heat from the lamp unit through the rotation shaft to the support body.

2. A vacuum processing apparatus according to claim 1, further comprising cooling means, provided at the support body, for dissipating the heat evolved by the thermo-module on a support body side of the support body.

3. A vacuum processing apparatus according to claim 2, wherein the cooling means are provided by an annular water passage provided at the support body and cooling water circulated through the annular water passage.

4. A vacuum processing apparatus according to claim 1, wherein the thermo-module absorbs and evolves heat by a Peltier effect and has a heat absorption face facing the rotation shaft and a heat evolution face facing the support body.

5. A vacuum processing apparatus according to claim 1, wherein the rotation shaft has a through hole extending along an axial direction thereof and opened to an outside.

6. A vacuum processing apparatus according to claim 5, wherein the rotation shaft has a plurality of heat radiating holes radially extending along a radial direction thereof.

7. A vacuum processing apparatus according to claim 6, wherein the heat radiating holes are opened at an outer peripheral surface of the rotation shaft and communicating with the through hole.

8. A vacuum processing apparatus according to claim 1, wherein the rotation shaft has a passage leading to the lamp unit and surrounding around the lamp unit and a cooling gas is supplied to the passage.

9. A vacuum processing apparatus according to claim 8, wherein an annular groove is provided in the support body at a contacting area between the support body and the rotation shaft and communicates with the passage.

10. A vacuum processing apparatus according to claim 9, wherein the support body has a gas supply port for supplying a gas to the passage.

11. A vacuum processing apparatus according to claim 1, wherein the contacting area between the rotation shaft and the support body is provided by contacting a flange provided on the rotation shaft and a flange provided on the support body with each other.

12. A vacuum processing apparatus according to claim 11, wherein a plurality of heat radiating holes are provided in the flange of the rotation shaft in a manner to extend along a radiating direction.

13. A vacuum processing apparatus according to claim 12, wherein the heat radiating holes are opened at a peripheral surface of the flange and communicate with a through hole extending along an axial direction of the rotation shaft and opened to an outside.

* * * * *